United States Patent
Iguchi et al.

(10) Patent No.: US 11,495,940 B2
(45) Date of Patent: Nov. 8, 2022

(54) LIGHT EMITTING DEVICE, OPTICAL DEVICE, AND MEASUREMENT DEVICE

(71) Applicant: FUJIFILM Business Innovation Corp., Tokyo (JP)

(72) Inventors: Daisuke Iguchi, Kanagawa (JP); Kazuhiro Sakai, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 154 days.

(21) Appl. No.: 17/110,304

(22) Filed: Dec. 3, 2020

(65) Prior Publication Data

US 2021/0265815 A1   Aug. 26, 2021

(30) Foreign Application Priority Data

Feb. 26, 2020 (JP) .............................. JP2020-030317

(51) Int. Cl.
 *H01S 5/042* (2006.01)
 *H01S 5/02255* (2021.01)
 *G01S 17/894* (2020.01)

(52) U.S. Cl.
 CPC ...... *H01S 5/04256* (2019.08); *H01S 5/02255* (2021.01); *G01S 17/894* (2020.01)

(58) Field of Classification Search
 CPC .................................................. H01S 5/02345
 USPC ....................................................... 372/38.1
 See application file for complete search history.

(56) References Cited

U.S. PATENT DOCUMENTS

2003/0026303 A1* 2/2003 Ouchi ..................... H01S 5/423
 372/50.1
2004/0208210 A1* 10/2004 Inoguchi ............. H01L 25/0753
 257/E33.072

FOREIGN PATENT DOCUMENTS

JP          2008252129          10/2008

\* cited by examiner

*Primary Examiner* — Tuan N Nguyen
(74) *Attorney, Agent, or Firm* — JCIPRNET

(57) ABSTRACT

A light emitting device includes a wiring board having a first wiring layer and a second wiring layer adjacent to the first wiring layer via an insulating layer, and a laser having a cathode electrode and an anode electrode, mounted on the wiring board, and driven through low-side driving. The first wiring layer includes a cathode wire connected to the cathode electrode, an anode wire connected to the anode electrode, and a first reference potential wire connected to a reference potential. The second wiring layer includes a second reference potential wire connected to the reference potential. An area of an overlap between the second reference potential wire and the anode wire is larger than an area of an overlap between the second reference potential wire and the first reference potential wire.

20 Claims, 10 Drawing Sheets

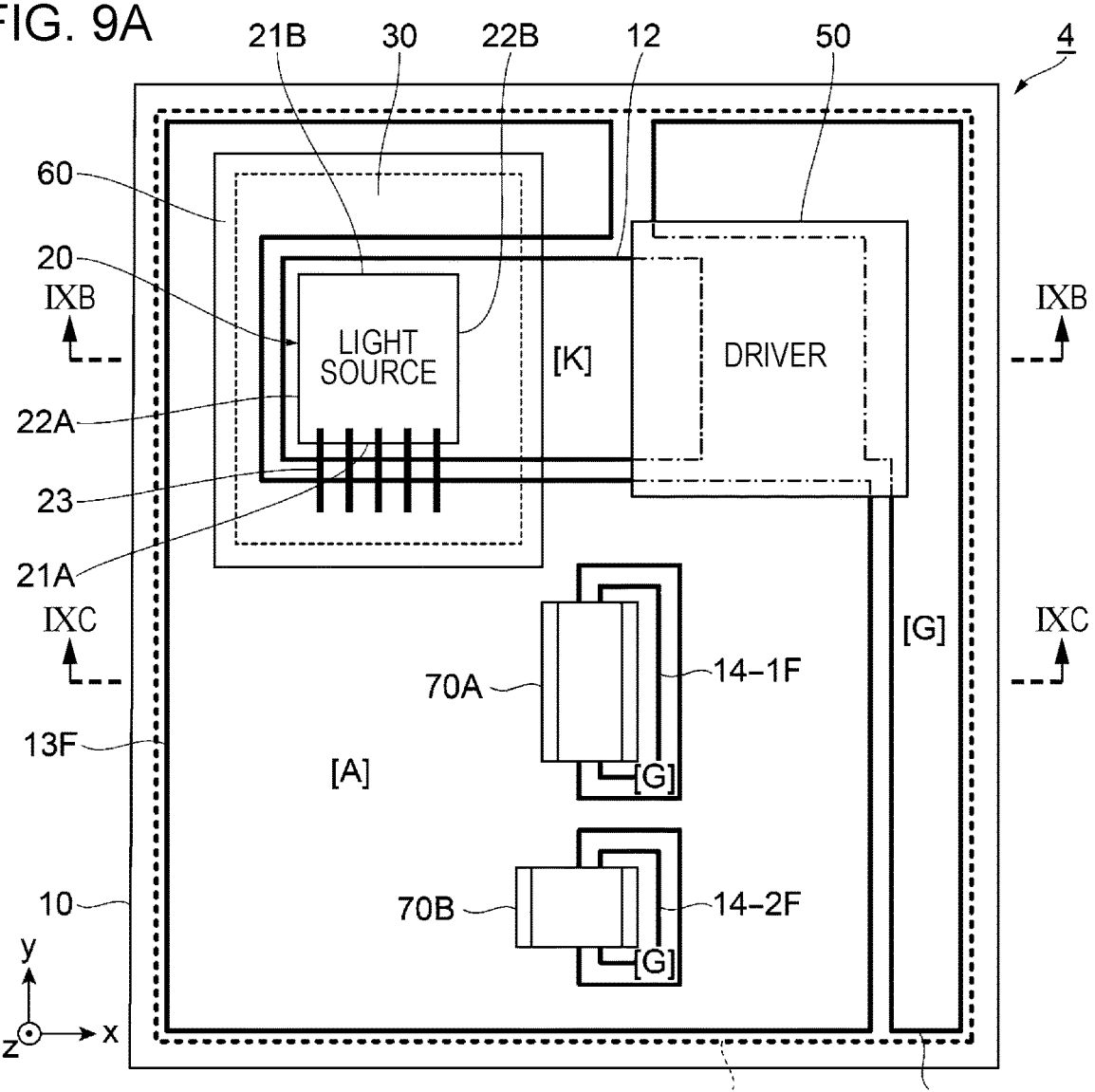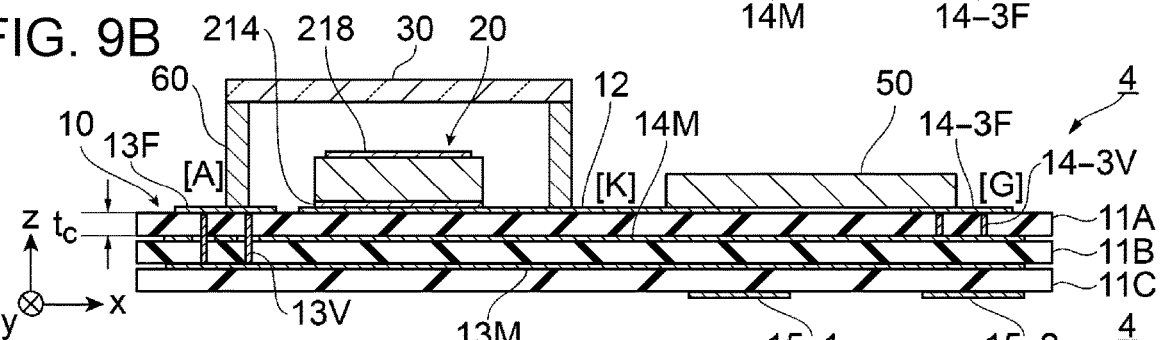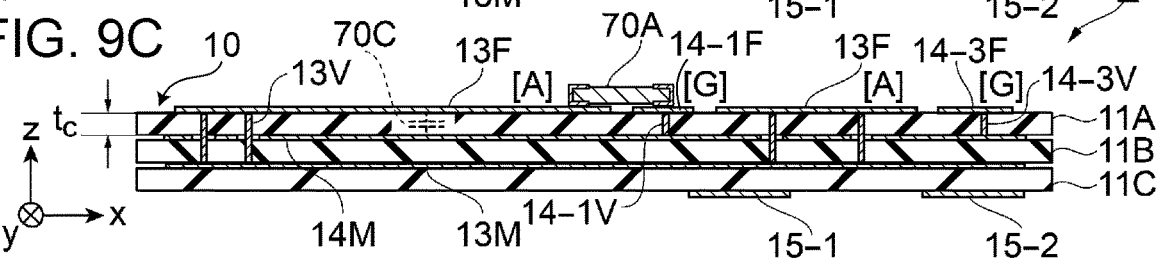

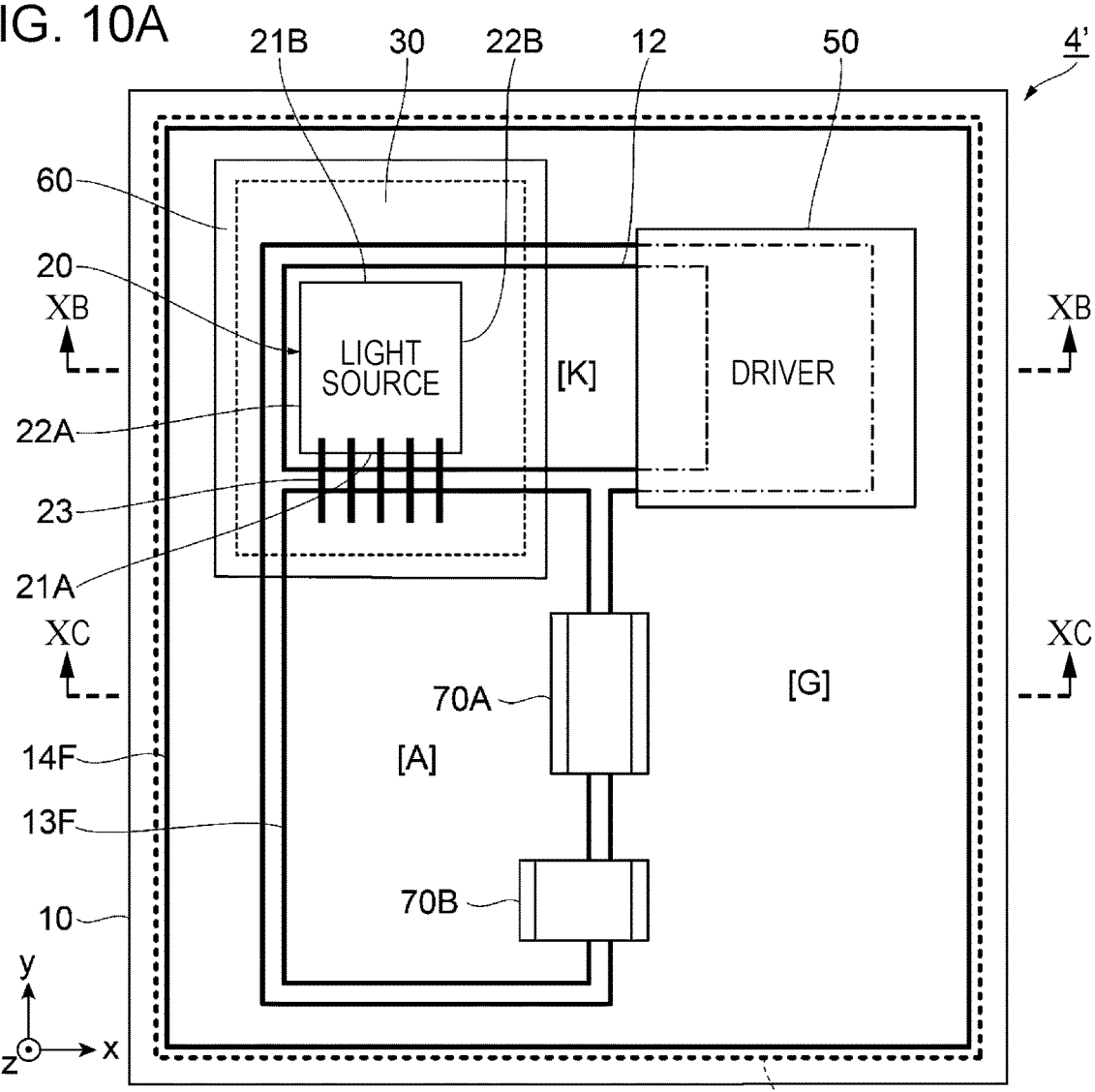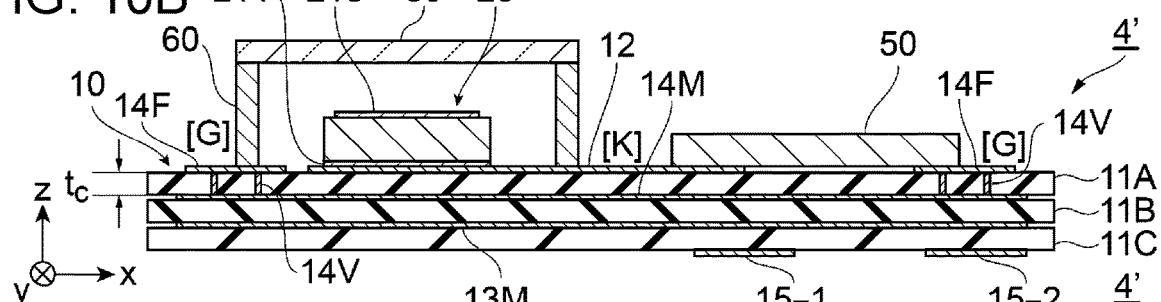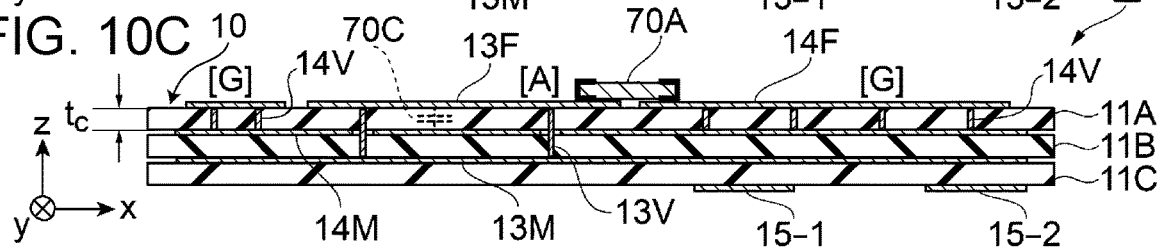

LIGHT EMITTING DEVICE, OPTICAL DEVICE, AND MEASUREMENT DEVICE

CROSS-REFERENCE TO RELATED APPLICATIONS

This application is based on and claims priority under 35 USC 119 from Japanese Patent Application No. 2020-030317 filed Feb. 26, 2020.

BACKGROUND

(i) Technical Field

The present disclosure relates to a light emitting device, an optical device, and a measurement device.

(ii) Related Art

Japanese Unexamined Patent Application Publication No. 2008-252129 describes a light emitting device including a light-transmissive ceramic substrate, a light emitting element mounted on the front face of the ceramic substrate, a wiring pattern for power supply to the light emitting element, and a metalized layer made of a metal having light reflectivity. The metalized layer is formed inside the ceramic substrate to reflect light emitted from the light emitting element.

SUMMARY

Aspects of non-limiting embodiments of the present disclosure relate to the following circumstances. Three-dimensional shapes of targets may be measured based on so-called Time of Flight (ToF) using a time of traveling light. In this case, it is appropriate to reduce a rising period of light to be emitted from a laser by reducing an inductance of a drive circuit that supplies a drive current to the laser.

Aspects of non-limiting embodiments of the present disclosure relate also to a light emitting device including a wiring board having a first wiring layer and a second wiring layer adjacent to the first wiring layer via an insulating layer, and a laser mounted on the wiring board and driven through low-side driving. In the light emitting device, it is appropriate to use more capacitive components between wires as a drive current for driving the laser compared with a case where the area of an overlap between a reference potential wire of the second wiring layer and an anode wire of the first wiring layer is smaller than the area of an overlap between the reference potential wire of the second wiring layer and a reference potential wire of the first wiring layer.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a light emitting device comprising a wiring board having a first wiring layer and a second wiring layer adjacent to the first wiring layer via an insulating layer, and a laser having a cathode electrode and an anode electrode, mounted on the wiring board, and driven through low-side driving. The first wiring layer comprises a cathode wire connected to the cathode electrode, an anode wire connected to the anode electrode, and a first reference potential wire connected to a reference potential. The second wiring layer comprises a second reference potential wire connected to the reference potential. An area of an overlap between the second reference potential wire and the anode wire is larger than an area of an overlap between the second reference potential wire and the first reference potential wire.

BRIEF DESCRIPTION OF THE DRAWINGS

An exemplary embodiment of the present disclosure will be described in detail based on the following figures, wherein:

FIG. 9A is a plan view of a light emitting device to which an exemplary embodiment is applied;

FIG. 9B is a sectional view of the light emitting device taken along the line IXB-IXB in FIG. 9A;

FIG. 9C is a sectional view of the light emitting device taken along the line IXC-IXC in FIG. 9A;

FIG. 10A is a plan view of a comparative light emitting device to which the exemplary embodiment is not applied;

FIG. 10B is a sectional view of the light emitting device taken along the line XB-XB in FIG. 10A; and FIG. 10C is a sectional view of the light emitting device taken along the line XC-XC in FIG. 10A.

DETAILED DESCRIPTION

An exemplary embodiment of the present disclosure is described below in detail with reference to the accompanying drawings.

There is a measurement device that measures three-dimensional shapes of targets based on so-called Time of Flight (ToF) using a time of traveling light. In ToF, the three-dimensional shape of a target is determined by measuring a period from a timing when a light source of the measurement device emits light to a timing when the emitted light is reflected on the target and received by a three-dimensional sensor (hereinafter referred to as "3D sensor") of the measurement device. The term "target" refers to an object subjected to measurement of its three-dimensional shape. The measurement of the three-dimensional shape may be referred to as "three-dimensional measurement", "3D measurement", or "3D sensing".

For example, the measurement device is mounted on a portable information processing apparatus and is used for facial recognition of users who are trying to access the apparatus. Related-art portable information processing apparatuses have employed user authentication using passwords, fingerprints, or irises. In recent years, there is a demand for authentication with higher security levels. To meet the demand, measurement devices that measure three-dimensional shapes are mounted on portable information processing apparatuses. That is, a three-dimensional image of the face of a user who is trying to access the portable information processing apparatus is acquired to determine whether the user is permitted to make access. Only a user authenticated as being permitted to make access may use the portable information processing apparatus.

The measurement device is also used in augmented reality (AR) or other technologies to continuously measure three-dimensional shapes of targets.

In the measurement device that measures three-dimensional shapes based on ToF, it is appropriate to reduce a rising period of light to be emitted from a laser (hereinafter referred to as "light source") in view of measurement accuracy. The rising period decreases along with a decrease in an inductance of a drive circuit that supplies a drive current for driving the light source. That is, as the inductance of the drive circuit increases, a drive current having a high frequency is difficult to flow. As a result, the rising period increases.

Structures, functions, methods, and other matters to be described in this exemplary embodiment below are applicable to measurement of three-dimensional shapes of targets in technologies other than facial recognition and augmented reality.

(Measurement Device 1)

Figure 1:
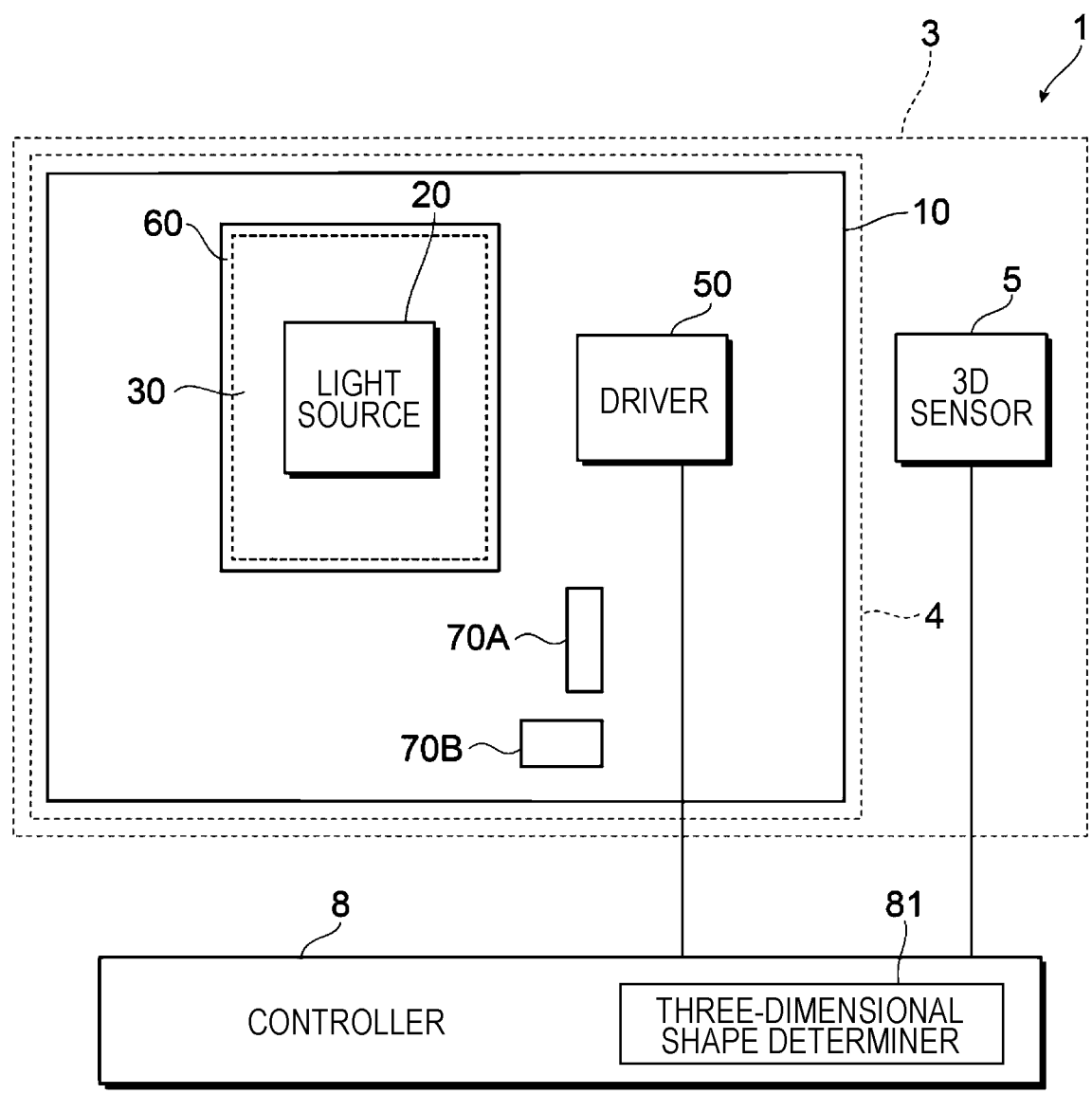
FIG. 1 is a block diagram illustrating an example of the structure of a measurement device that measures three-dimensional shapes.

FIG. 1 is a block diagram illustrating an example of the structure of a measurement device 1 that measures three-dimensional shapes.

The measurement device 1 includes an optical device 3 and a controller 8. The controller 8 controls the optical device 3. The controller 8 includes a three-dimensional shape determiner 81 that determines three-dimensional shapes of targets. The controller 8 is a computer including a CPU, a ROM, and a RAM. The ROM is a non-volatile rewritable memory such as a flash memory. Programs and constants stored in the ROM are loaded on the RAM and the CPU executes the programs to implement the three-dimensional shape determiner 81. Thus, three-dimensional shapes of targets are determined.

The optical device 3 includes a light emitting device 4 and a 3D sensor 5.

The light emitting device 4 includes a wiring board 10, a light source 20, a light diffusion member 30, a driver 50, a holder 60, and capacitors 70A and 70B. The capacitor 70A is a capacitor whose equivalent series inductance (ESL) is reduced (hereinafter referred to as "low ESL capacitor"). The capacitor 70B is a capacitor having a higher ESL than the capacitor 70A (hereinafter referred to as "non-low ESL capacitor"). As described later, the wiring board 10 has a capacitor formed from a parasitic capacitance due to the structure of the wiring board 10 ("capacitor 70C" in FIGS. 5 and 9A to 9C). Although FIG. 1 illustrates a single capacitor 70A and a single capacitor 70B, a plurality of capacitors may be provided as either or both of the capacitors 70A and 70B. The light emitting device 4 may have circuit components such as other capacitors or resistors to operate the driver 50. The capacitors 70A, 70B, and 70C are referred to as "capacitors 70" or "capacitors" unless otherwise distinguished. The capacitors (low ESL capacitor and non-low ESL capacitor) are described later. The capacitor may be referred to as "capacitive element". The capacitors 70A and 70B are examples of the capacitive element. The capacitor formed from the parasitic capacitance (capacitor 70C) is an example of a capacitive component.

The light source 20, the driver 50, the capacitors 70A and 70B, and the holder 60 are provided on the front face of the wiring board 10. In FIG. 1, the 3D sensor 5 is not provided on the front face of the wiring board 10 but may be provided on the front face of the wiring board 10. The light diffusion member 30 is provided on the holder 60. The term "front face" is a near side of the drawing sheet of FIG. 1. More specifically, a side of the wiring board 10 where the light source 20 and other components are provided is referred to as "front face", "front side", or "front face side".

Figure 2:
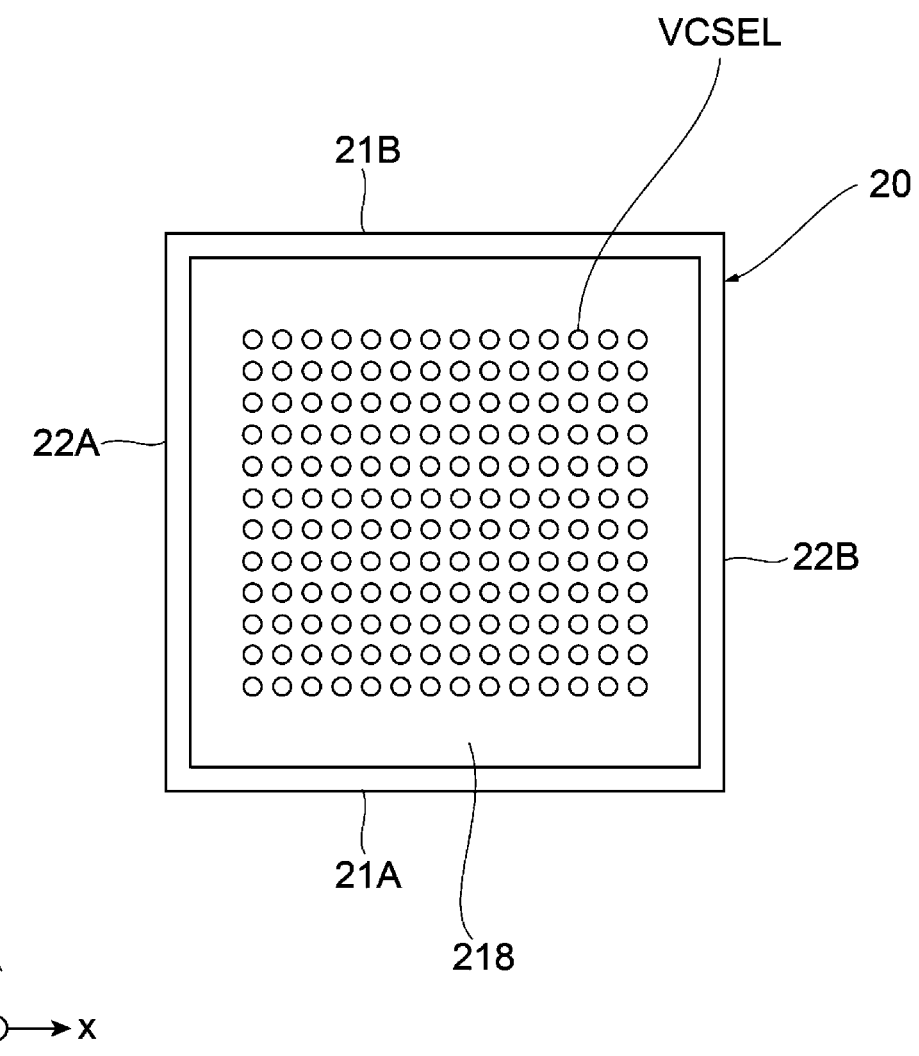
FIG. 2 is a plan view of a light source.

The light source 20 is a surface emitting laser element array having a plurality of surface emitting laser elements arranged in a two-dimensional matrix (see FIG. 2). Examples of the surface emitting laser element include a vertical cavity surface emitting laser (VCSEL). The surface emitting laser element is hereinafter described as the VCSEL. Since the light source 20 is provided on the front face of the wiring board 10, the light source 20 emits light outward in a direction perpendicular to the front face of the wiring board 10. The light source 20 is an example of the laser.

The light emitted from the light source 20 enters the light diffusion member 30 and is output while being diffused by the light diffusion member 30. The light diffusion member 30 covers the light source 20. That is, the light diffusion member 30 keeps a predetermined distance from the light source 20 on the wiring board 10 by the holder 60 provided on the front face of the wiring board 10. Thus, the light emitted from the light source 20 is diffused by the light diffusion member 30 and is radiated onto a target. Compared with a case where the light diffusion member 30 is not provided, the light emitted from the light source 20 is radiated in a wider range by being diffused by the light diffusion member 30.

In the three-dimensional measurement based on ToF, it is appropriate that the driver 50 drive the light source 20 to emit, for example, pulsed light at a frequency of 100 MHz or higher and a rising period of 1 ns or shorter (hereinafter referred to as "emitted light pulse"). That is, the light source 20 is driven to emit the emitted light pulse by a drive current pulse supplied from a drive circuit that drives the light source 20. In the example of facial recognition, the light radiation distance is about 10 cm to about 1 m. The light radiation range is about 1 m². The light radiation distance is referred to as "measurement distance". The light radiation range is referred to as "radiation range" or "measurement range". An imaginary plane in the radiation range or the measurement range is referred to as "radiation plane". In technologies other than facial recognition, the measurement distance to a target and the radiation range on the target may take values other than the above.

The 3D sensor 5 has a plurality of light receiving cells and outputs a signal corresponding to a period from a timing when the light source 20 emits light to a timing when the 3D sensor 5 receives the light. For example, each light receiving cell of the 3D sensor 5 receives pulsed reflected light, which is originally the emitted light pulse from the light source 20 and is reflected on the target (hereinafter referred to as "received light pulse"), and accumulates a charge corresponding to a period required until the light reception. The 3D sensor 5 is a CMOS device in which each light receiving cell has two gates and charge accumulators associated with the gates. Photoelectrons generated by alternately applying pulses to the two gates are transferred to one of the two charge accumulators at high speed. Each charge accumulator accumulates a charge corresponding to a phase difference between the emitted light pulse and the received light pulse. The 3D sensor 5 outputs a digital signal corresponding to the phase difference between the emitted light pulse and the received light pulse in each light receiving cell via an AD converter. That is, the 3D sensor 5 outputs a signal corresponding to a period from a timing when the light source 20 emits light to a timing when the 3D sensor 5 receives the light. In other words, a signal corresponding to a three-dimensional shape of the target is acquired from the 3D sensor 5. Therefore, it is appropriate to reduce a rising period of the emitted light pulse and a rising period of the received light pulse. That is, it is appropriate to reduce a rising period of the drive current pulse to be supplied to drive the light source 20. The AD converter may be provided inside or outside the 3D sensor 5. The 3D sensor 5 is an example of a light receiver.

For example, if the 3D sensor 5 is the CMOS device, the three-dimensional shape determiner 81 of the controller 8 acquires the digital signal for each light receiving cell and calculates a distance to the target for each light receiving cell. The three-dimensional shape determiner 81 determines the three-dimensional shape of the target based on the calculated distance and outputs the determination result.

As described above, the controller 8 is the computer and the three-dimensional shape determiner 81 is implemented by the programs. Those components may be implemented by an integrated circuit such as an ASIC or an FPGA. Those components may also be implemented by software such as a program and an integrated circuit such as an ASIC.

As described above, the measurement device 1 diffuses the light emitted from the light source 20 and radiates the diffused light onto the target, and the 3D sensor 5 receives the light reflected on the target. In this manner, the measurement device 1 measures the three-dimensional shape of the target.

In FIG. 1, the optical device 3 and the controller 8 are provided separately but may be integrated together.

Description is first made of the light source 20, the light diffusion member 30, the driver 50, and the capacitors (capacitors 70A, 70B, and 70C) of the light emitting device 4.

(Structure of Light Source 20)

FIG. 2 is a plan view of the light source 20. The light source 20 has a plurality of VCSELs in a two-dimensional array. In FIG. 2, the VCSELs are arrayed at individual lattice points of a square lattice but may be arrayed by other methods. As described above, the light source 20 is the surface emitting laser element array having the VCSELs as surface emitting laser elements. In the drawing sheet, a rightward direction is an x direction and an upward direction is a y direction. A direction orthogonal counterclockwise to the x direction and the y direction is a z direction. A front face of the light source 20 is a face on a near side of the drawing sheet, that is, on a +z side. A back face of the light source 20 is a face on a far side of the drawing sheet, that is, on a −z side. The plan view of the light source 20 is an illustration of the light source 20 viewed from the front face. The "front face", "front side", or "front face side" of the light source 20 is a side of an epitaxial layer that functions as an emission layer (active region 206 described later).

The VCSEL is a surface emitting laser element having an active region serving as a light emitting region between a lower multilayer mirror and an upper multilayer mirror stacked on a semiconductor substrate 200 (see FIG. 3) and configured to emit laser light in a direction perpendicular to the surface. For example, the light source 20 has 100 to 1000 VCSELs. The plurality of VCSELs are connected and driven in parallel. The number of VCSELs is an example and may be set depending on the measurement distance or the radiation range.

An anode electrode 218 common to the plurality of VCSELs is provided on the front face of the light source 20. A cathode electrode 214 is provided on the back face of the light source 20 (see FIG. 3). That is, the plurality of VCSELs are connected in parallel. Since the plurality of VCSELs are connected and driven in parallel, high-intensity light is emitted compared with a case where the VCSELs are driven individually.

The shape of the light source 20 viewed from the front face (hereinafter referred to as "plan shape") is a rectangular shape. A lateral face on a −y side is a lateral face 21A. A lateral face on a +y side is a lateral face 21B. A lateral face on a −x side is a lateral face 22A. A lateral face on a +x side is a lateral face 22B. The lateral face 21A is opposite to the lateral face 21B. The lateral face 22A and the lateral face 22B connect the lateral face 21A to the lateral face 21B and are opposite to each other.

(Structure of VCSEL)

Figure 3:
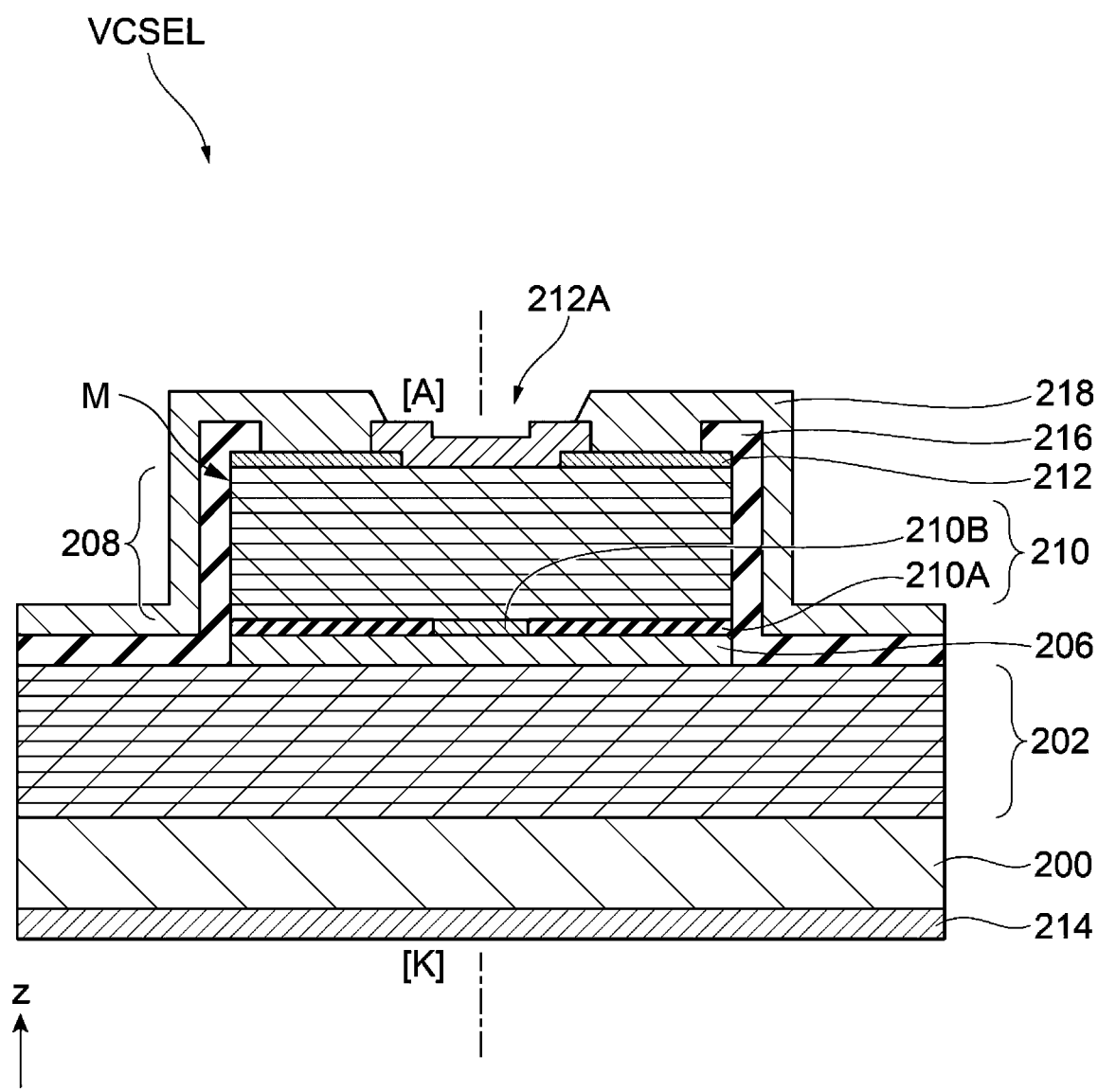
FIG. 3 illustrates the sectional structure of one VCSEL of the light source.

FIG. 3 illustrates the sectional structure of one VCSEL of the light source 20. The VCSEL is a λ-cavity VCSEL. In the drawing sheet, an upward direction is a z direction, a +z side is an upper side, and a −z side is a lower side.

In the VCSEL, an n-type lower distributed Bragg reflector (DBR) 202 obtained by alternately stacking AlGaAs layers having different Al compositions, the active region 206 having a quantum well layer sandwiched between an upper spacer layer and a lower spacer layer, and a p-type upper DBR 208 obtained by alternately stacking AlGaAs layers having different Al compositions are stacked in this order on the n-type GaAs semiconductor substrate 200.

The n-type lower DBR 202 is a stack of $Al_{0.9}Ga_{0.1}As$ layers and GaAs layers in pairs. The layers of the lower DBR 202 each have a thickness of $\lambda/4n_r$ ($\lambda$ is an oscillation wavelength and $n_r$ is a refractive index of a medium) and are alternately stacked by 40 periods. As a carrier, the lower DBR 202 is doped with silicon (Si), which is an n-type impurity. For example, the carrier density is $3 \times 10^{18}$ cm$^{-3}$.

The active region 206 is a stack of the lower spacer layer, the quantum well active layer, and the upper spacer layer. For example, the lower spacer layer is an undoped $Al_{0.6}Ga_{0.4}As$ layer, the quantum well active layer includes an undoped InGaAs quantum well layer and an undoped GaAs barrier layer, and the upper spacer layer is an undoped $Al_{0.6}Ga_{0.4}As$ layer.

The p-type upper DBR 208 is a stack of p-type $Al_{0.9}Ga_{0.1}As$ layers and GaAs layers in pairs. The layers of the upper DBR 208 each have a thickness of $\lambda/4n_r$ and are alternately stacked by 29 periods. As a carrier, the upper DBR 208 is doped with carbon (C), which is a p-type impurity. For example, the carrier density is $3 \times 10^{18}$ cm$^{-3}$. A p-type GaAs contact layer is preferably formed as an uppermost layer of the upper DBR 208, and a p-type AlAs current confinement layer 210 is preferably formed as a lowermost or internal layer of the upper DBR 208.

The stacked semiconductor layers from the upper DBR 208 to the lower DBR 202 are etched to form a columnar mesa M on the semiconductor substrate 200. Thus, the current confinement layer 210 is exposed at the lateral faces of the mesa M. Through oxidation, the current confinement layer 210 has an oxide region 210A that is oxidized from the lateral faces of the mesa M, and a conductive region 210B surrounded by the oxide region 210A. In the oxidation, the AlAs layer has a higher oxidation rate than the AlGaAs layer, and the oxide region 210A is oxidized at a substantially constant rate from the lateral faces of the mesa M to the inside of the mesa M. Therefore, the sectional shape of the conductive region 210B is a shape that reflects the outer shape of the mesa M, that is, a circular shape, and the center of the conductive region 210B substantially coincides with the axis of the mesa M indicated by the chain line. In this exemplary embodiment, the mesa M has a columnar structure.

An annular metal p-side electrode 212 obtained by stacking Ti/Au layers is formed as an uppermost layer of the mesa M. The p-side electrode 212 is in ohmic contact with the contact layer of the upper DBR 208. An inner part of the annular p-side electrode 212 is a light exit port 212A through which laser light is emitted to the outside. That is, the VCSEL emits light in the +z direction perpendicular to the front face of the semiconductor substrate 200 (face on the +z side). The axis of the mesa M is an optical axis. The cathode electrode 214 is formed on the back face of the semiconductor substrate 200 as an n-side electrode. The front face (face on the +z side) of the upper DBR 208 on the inner side of the p-side electrode 212 is a light emitting surface.

An insulating film 216 covers the surface of the mesa M except for the light exit port 212A and a part where the anode electrode 218 is connected to the p-side electrode 212. The anode electrode 218 is in ohmic contact with the p-side electrode 212 except for the light exit port 212A. The anode electrode 218 is common to the plurality of VCSELs. That is, the p-side electrodes 212 of the plurality of VCSELs of the light source 20 are connected in parallel by the anode electrode 218.

In FIG. 3, an anode symbol [A] is placed at the anode electrode 218, and a cathode symbol [K] is placed at the cathode electrode 214.

The VCSEL may oscillate in a single transverse mode or a multiple transverse mode. For example, the power of light from one VCSEL is 4 mW to 8 mW. If the light source 20 has 500 VCSELs, the power of light from the light source 20 is 2 W to 4 W.

(Structure of Light Diffusion Member 30)

Figure 4A:
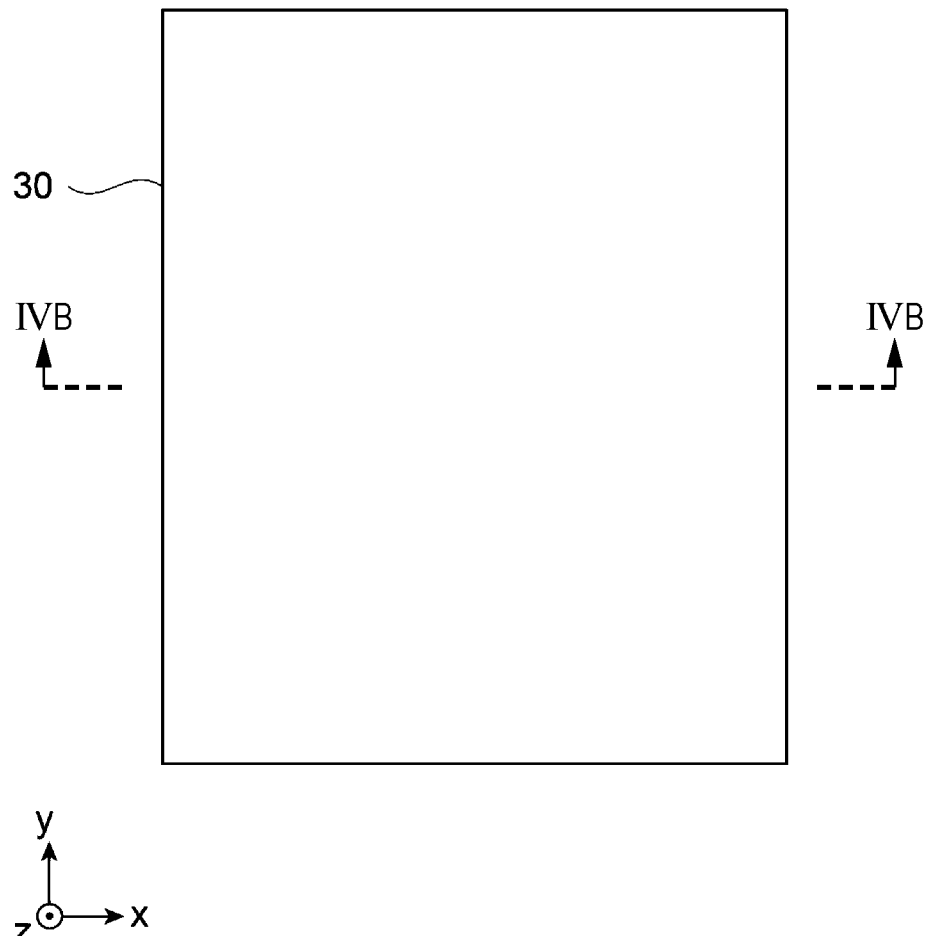
FIG. 4A is a plan view of an example of a light diffusion member.
Figure 4B:
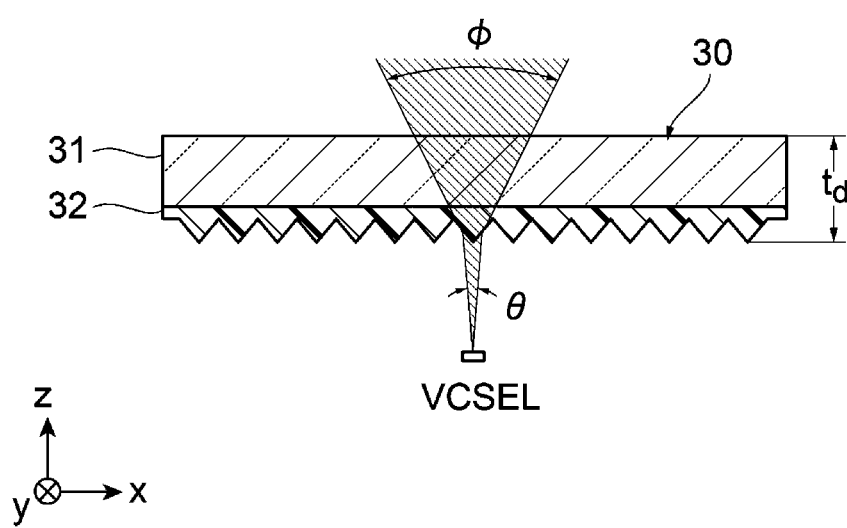
FIG. 4B is a sectional view of the light diffusion member taken along the line IVB-IVB in FIG. 4A.

FIGS. 4A and 4B illustrate an example of the light diffusion member 30. FIG. 4A is a plan view and FIG. 4B is a sectional view taken along the line IVB-IVB in FIG. 4A. In the drawing sheet of FIG. 4A, a rightward direction is an x direction and an upward direction is a y direction. A direction orthogonal counterclockwise to the x direction and the y direction is a z direction. In the light diffusion member 30, a +z side is referred to as "front face" or "front face side", and a −z side is referred to as "back face" or "back face side". In the drawing sheet of FIG. 4B, a rightward direction is the x direction, a rearward direction is the y direction, and an upward direction is the z direction.

As illustrated in FIG. 4B, the light diffusion member 30 has, for example, a resin layer 32 having irregularities for light diffusion on the back face (−z side) of a flat glass base 31 having parallel faces. The light diffusion member 30 outputs light incident from the VCSELs of the light source 20 while increasing a divergence angle of the light. That is, the irregularities of the resin layer 32 of the light diffusion member 30 refract or scatter the incident light to output the light at a larger divergence angle. As illustrated in FIG. 4B, the light diffusion member 30 diffuses light emitted from the VCSELs at a divergence angle θ and entering the back face (−z side) of the light diffusion member 30 and outputs the light from the front face (+z side) at a divergence angle σ larger than the divergence angle θ (θ<σ). With the light diffusion member 30, the area of the radiation plane of the light emitted from the light source 20 is increased compared with a case where the light diffusion member 30 is not used. Each of the divergence angles θ and σ is a full width at half maximum (FWHM).

The plan shape of the light diffusion member 30 is a rectangular shape. A thickness td (in the z direction) of the light diffusion member 30 is 0.1 mm to 1 mm. The plan shape of the light diffusion member 30 may be a polygonal shape, a circular shape, or other shapes.

(Driver 50 and Capacitors 70A and 70B)

To drive the light source 20 at a higher speed, low-side driving is appropriate. The low-side driving refers to a structure in which a drive element such as a MOS transistor is positioned on a downstream side of a driving target such as the VCSEL along a path where a current flows (hereinafter referred to as "current path"). Conversely, a structure in which the drive element is positioned on an upstream side is referred to as "high-side driving".

Figure 5:
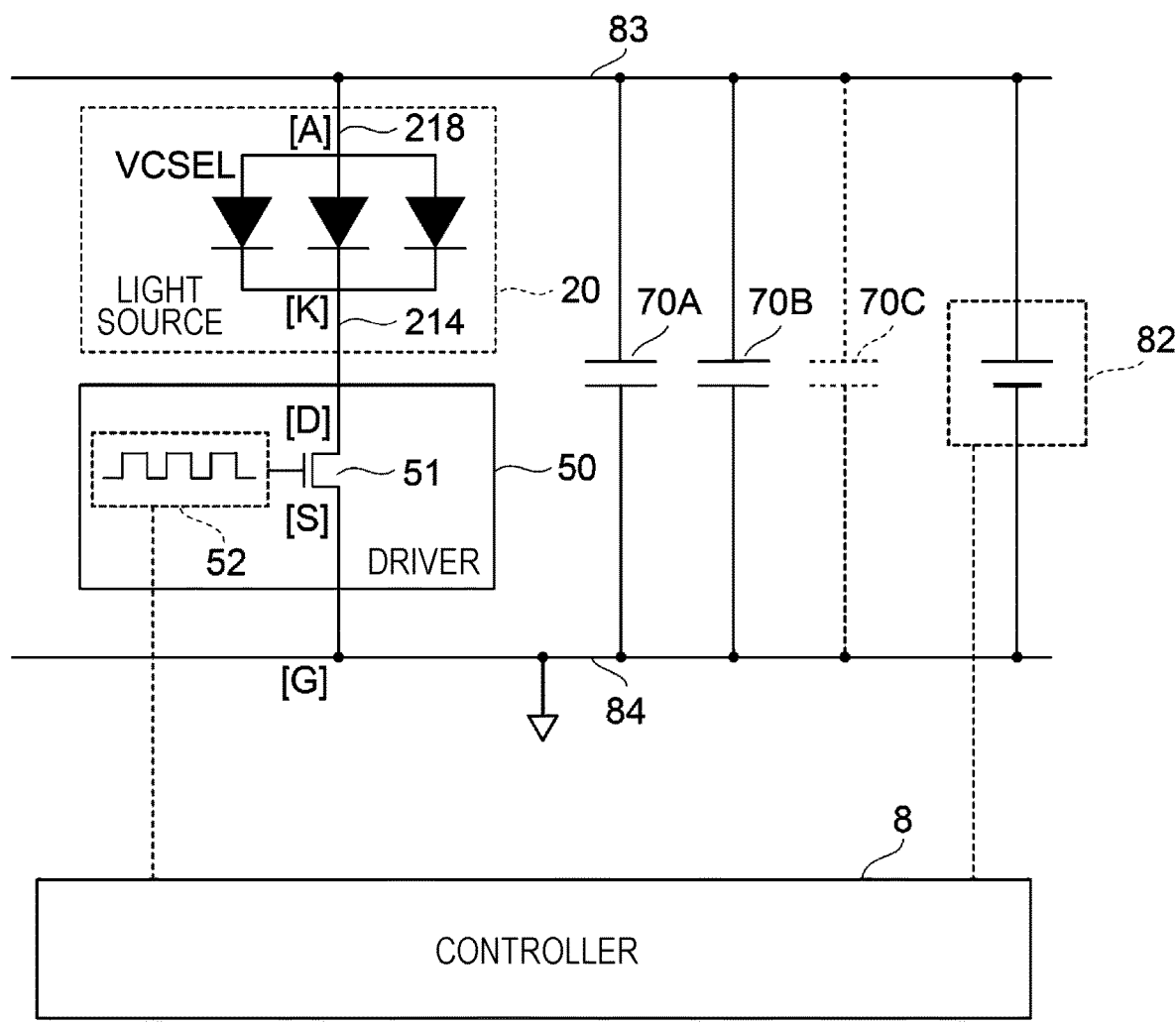
FIG. 5 illustrates an example of an equivalent circuit in a case where the light source is driven through low-side driving.

FIG. 5 illustrates an example of an equivalent circuit in a case where the light source 20 is driven through the low-side driving. FIG. 5 illustrates the VCSEL of the light source 20, the driver 50, the capacitors 70A, 70B, and 70C, and a power supply 82. As described above, the capacitor 70C is the parasitic capacitance due to the structure of the wiring board 10. The capacitor 70C is indicated by broken lines. FIG. 5 also illustrates the controller 8 in FIG. 1. The power supply 82 is provided on the controller 8. The power supply 82 generates a DC voltage with a power supply potential on a positive side and a reference potential on a negative side. The power supply potential is supplied to a power supply line 83. The reference potential is supplied to a reference line 84. The reference potential may be a ground potential (may be represented by "GND"; symbol [G] in FIG. 5).

As described above, the light source 20 has the plurality of VCSELs connected in parallel. The anode electrode 218 of the VCSEL (see FIG. 3; symbol [A] in FIG. 5) is connected to the power supply line 83.

The driver 50 includes an n-channel MOS transistor 51 and a signal generation circuit 52 that turns ON or OFF the MOS transistor 51. A drain of the MOS transistor 51 (symbol [D] in FIG. 5) is connected to the cathode electrode 214 of the VCSEL (see FIG. 3; symbol [K] in FIG. 5). A source of the MOS transistor 51 (symbol [S] in FIG. 5) is connected to the reference line 84. A gate of the MOS transistor 51 is connected to the signal generation circuit 52. That is, the VCSEL and the MOS transistor 51 of the driver 50 are connected in series between the power supply line 83 and the reference line 84. The controller 8 controls the signal generation circuit 52 to generate an "H-level" signal for turning ON the MOS transistor 51, and an "L-level" signal for turning OFF the MOS transistor 51.

In each of the capacitors 70A, 70B, and 70C, a first terminal is connected to the power supply line 83 (symbol [A] in the VCSEL of FIG. 5) and a second terminal is connected to the reference line 84 (symbol [G] in FIG. 5).

Next, description is made of a method for driving the light source 20 through the low-side driving.

First, the signal generated by the signal generation circuit 52 of the driver 50 is "L-level". In this case, the MOS transistor 51 is OFF. That is, no current flows between the source ([S] in FIG. 5) and the drain ([D] in FIG. 5) of the MOS transistor 51. Thus, no current flows through the VCSEL connected in series to the MOS transistor 51. That is, the VCSEL does not emit light.

The capacitors 70A, 70B, and 70C are connected to the power supply 82. The first terminals of the capacitors 70A, 70B, and 70C (terminals on the [A] side in the VCSEL of FIG. 5) connected to the power supply line 83 have power supply potentials. The second terminals of the capacitors 70A, 70B, and 70C (terminals on the [G] side in FIG. 5) connected to the reference line 84 have reference potentials. Thus, the capacitors 70A, 70B, and 70C are charged with flows of current from the power supply 82 (with supply of charges).

Next, the signal generated by the signal generation circuit 52 of the driver 50 becomes "H-level" and the MOS transistor 51 is switched from OFF to ON. Then, closed loops are formed between the capacitors 70A, 70B, and 70C and the MOS transistor 51 and the VCSEL connected in series, and the charges accumulated in the capacitors 70A, 70B, and 70C are supplied to the MOS transistor 51 and the VCSEL. That is, a current flows through the VCSEL and the VCSEL emits light. The closed loop is a drive circuit that supplies a drive current for causing the light source 20 to emit light. The drive current is supplied from each of the capacitors 70A, 70B, and 70C. Therefore, the drive circuit is formed in association with each of the capacitors 70A, 70B, and 70C. The supply of the drive current for causing the light source 20 to emit light may be expressed as "driving of the light source 20".

When the signal generated by the signal generation circuit 52 of the driver 50 becomes "L-level" again, the MOS transistor 51 is switched from ON to OFF. Therefore, the closed loops between the capacitors 70A, 70B, and 70C and the MOS transistor 51 and the VCSEL connected in series become open loops, and no current flows through the VCSEL. Thus, the VCSEL stops light emission. Then, the capacitors 70A, 70B, and 70C are charged with flows of current from the power supply 82 (with supply of charges).

As described above, the MOS transistor 51 is repeatedly turned ON and OFF and the light emission of the VCSEL is also repeatedly turned ON and OFF every time the signal output from the signal generation circuit 52 changes between "H-level" and "L-level". The repetition of ON/OFF of the MOS transistor 51 may be referred to as "switching".

As described above, when the MOS transistor 51 is switched from OFF to ON, the drive current is supplied to the VCSEL by releasing the charges in the capacitors 70A, 70B, and 70C at a time.

The capacitors (low ESL capacitor and non-low ESL capacitor) are described.

Figure 6A:
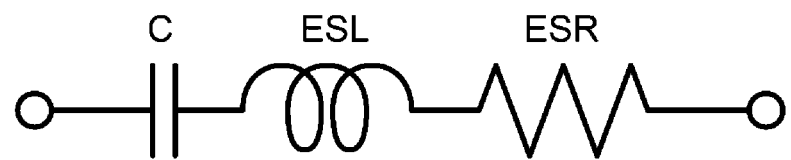
FIG. 6A illustrates an equivalent circuit of a capacitor.
Figure 6B:
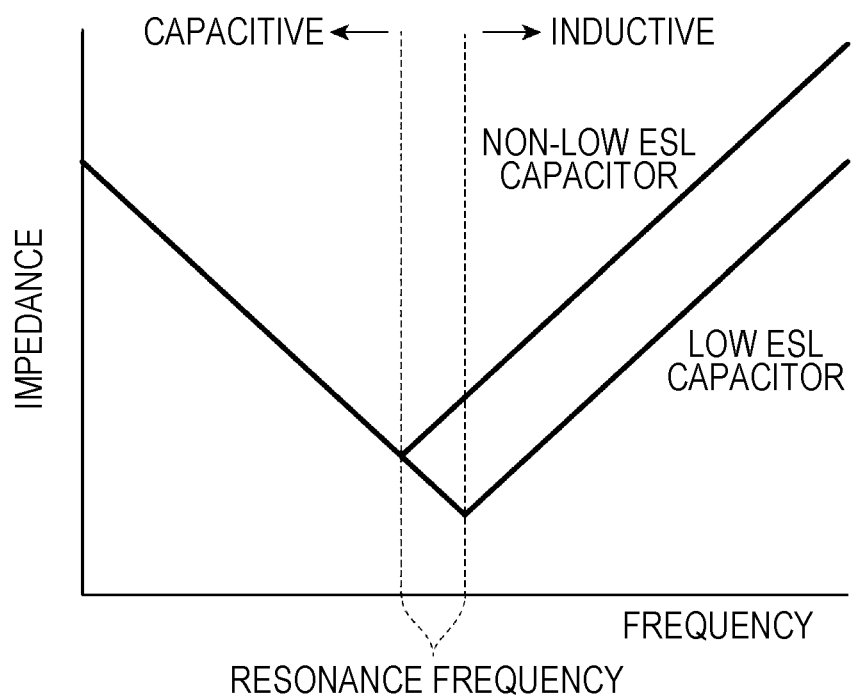
FIG. 6B illustrates frequency characteristics of impedances of capacitors.

FIGS. 6A and 6B illustrate the capacitors. FIG. 6A illustrates an equivalent circuit of a capacitor. FIG. 6B illustrates frequency characteristics of impedances of the capacitors. In FIG. 6B, the horizontal axis represents a frequency and the vertical axis represents an impedance.

As illustrated in FIG. 6A, the capacitor is represented by an equivalent circuit in which a capacitance C, an equivalent series inductance ESL, and an equivalent series resistance ESR are connected in series.

As illustrated in FIG. 6B, if the frequency is low, the impedance is determined by the capacitance C of the capacitor. That is, the capacitor is capacitive and the impedance decreases along with the frequency. If the frequency is high, the impedance is determined by the equivalent series inductance ESL of the capacitor. That is, the capacitor is inductive and the impedance increases along with the frequency. A frequency at which the same impedance is obtained by both the capacitance C and the equivalent series inductance ESL is referred to as "resonance frequency".

To reduce the rising period of the drive current pulse to be supplied to the light source 20, it is appropriate to reduce the impedance at a high frequency, that is, reduce the equivalent series inductance ESL. That is, it is appropriate to use a capacitor configured to reduce the equivalent series inductance ESL, that is, use the low ESL capacitor to reduce the rising period of the drive current pulse. As illustrated in FIG. 6B, the low ESL capacitor has a smaller impedance at a high frequency than the non-low ESL capacitor having a higher equivalent series inductance ESL than the low ESL capacitor.

Figure 7A:
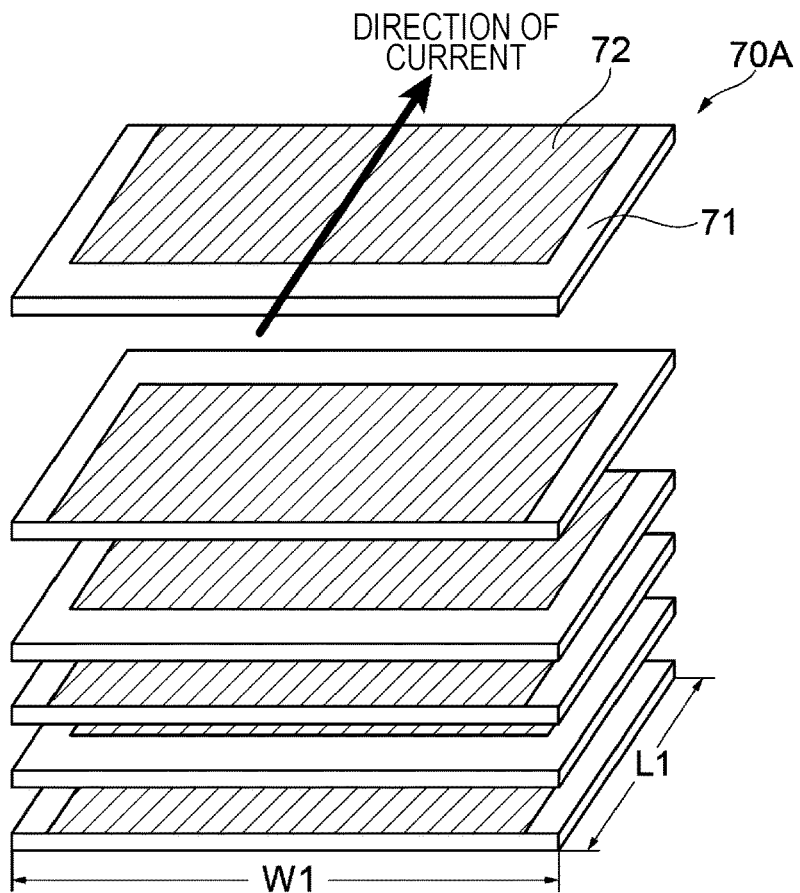
FIG. 7A illustrates an example of a low ESL capacitor.
Figure 7B:
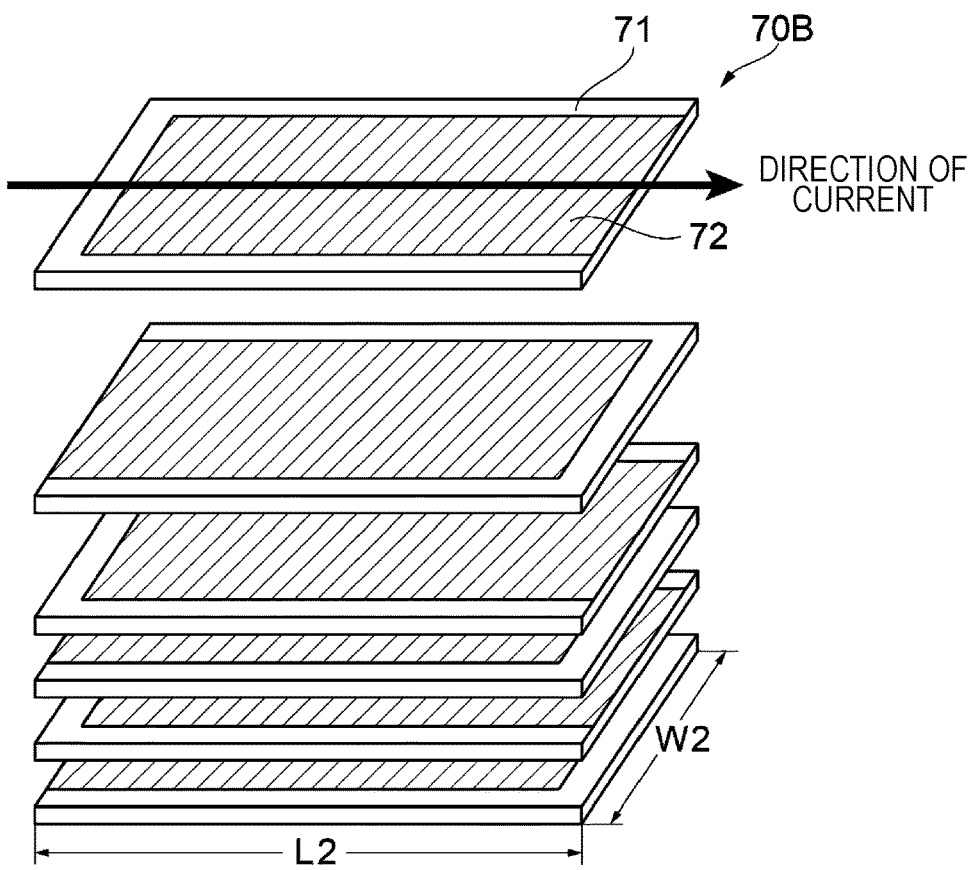
FIG. 7B illustrates an example of a non-low ESL capacitor.

FIGS. 7A and 7B illustrate examples of the low ESL capacitor (capacitor 70A) and the non-low ESL capacitor (capacitor 70B). FIG. 7A illustrates the low ESL capacitor (capacitor 70A). FIG. 7B illustrates the non-low ESL capacitor (capacitor 70B). Those capacitors are dual-terminal multilayer ceramic capacitors. As illustrated in FIGS. 7A and 7B, the multilayer ceramic capacitor is structured by a plurality of stacks of a ceramic sheet 71 made of a titanium oxide or a barium titanate and having a rectangular shape as its plan shape, and an internal wire 72 provided on the front face of the ceramic sheet 71.

In the low ESL capacitor 70A illustrated in FIG. 7A, a current flows in a transverse direction of the ceramic sheet 71 having the rectangular shape as its plan shape. That is, the low ESL capacitor is a dual-terminal multilayer ceramic capacitor having electrodes at both ends in the transverse direction. A length L1 is defined in the current flow direction of the ceramic sheet 71 (transverse direction) and a width W1 is defined in a direction orthogonal to the current flow direction (longitudinal direction). In this case, the length L1 is smaller than the width W1 (L1<W1). By reducing the length of the current path in this manner, the equivalent series inductance ESL is lower than that of the non-low ESL capacitor described next. The low ESL capacitor having the width W1 larger than the length L1 may be referred to as "LW-reverse type capacitor".

In the non-low ESL capacitor 70B illustrated in FIG. 7B, a current flows in a longitudinal direction of the ceramic sheet 71 having the rectangular shape as its plan shape. That is, the non-low ESL capacitor is a dual-terminal multilayer ceramic capacitor having electrodes at both ends in the longitudinal direction. A length L2 is defined in the current flow direction of the ceramic sheet (longitudinal direction) and a width W2 is defined in a direction orthogonal to the current flow direction (transverse direction). In this case, the length L2 is larger than the width W2 (L2>W2). Thus, the length of the current path increases and the equivalent series inductance ESL is higher than that of the low ESL capacitor.

The area of the low ESL capacitor mounted on the wiring board 10 is large but the rated capacity is relatively small. If the low ESL capacitor 70A is used alone without the non-low ESL capacitor 70B, a plurality of capacitors 70A are needed to drive the light source 20 at about 2 W. In this case, the capacitors 70A differ from each other in terms of current paths to the VCSEL. In a long current path, a wiring inductance increases. That is, the area of the plurality of low ESL capacitors 70A mounted on the wiring board 10 increases but the equivalent series inductance ESL is not sufficiently low.

The non-low ESL capacitor uses a ceramic sheet 71 having a high dielectric constant and the rated capacity is relatively large though the area of the non-low ESL capacitor mounted on the wiring board 10 is small. Therefore, one non-low ESL capacitor suffices to drive the light source 20 at about 2 W. However, the equivalent series inductance ESL is higher than that of the low ESL capacitor. Therefore, it is difficult to reduce the rising period of the drive current pulse to be supplied to the light source 20.

In this exemplary embodiment, the low ESL capacitor 70A and the non-low ESL capacitor 70B are used in combination. The low ESL capacitor 70A and the non-low ESL capacitor 70B are connected in parallel.

In this exemplary embodiment, the capacitor 70C formed from the parasitic capacitance due to the structure of the wiring board 10 is used. Therefore, the rising period of the drive current pulse to be supplied to the light source 20 may further be reduced. As described later, the equivalent series inductance ESL of the capacitor formed from the parasitic capacitance due to the structure of the wiring board 10 is lower than that of the low ESL capacitor. By using the capacitor 70C formed from the parasitic capacitance, the rising period of the current pulse to be supplied to the light source 20 may further be reduced. As described below, the parasitic capacitance due to the structure of the wiring board 10 is increased in this exemplary embodiment.

Figure 8:
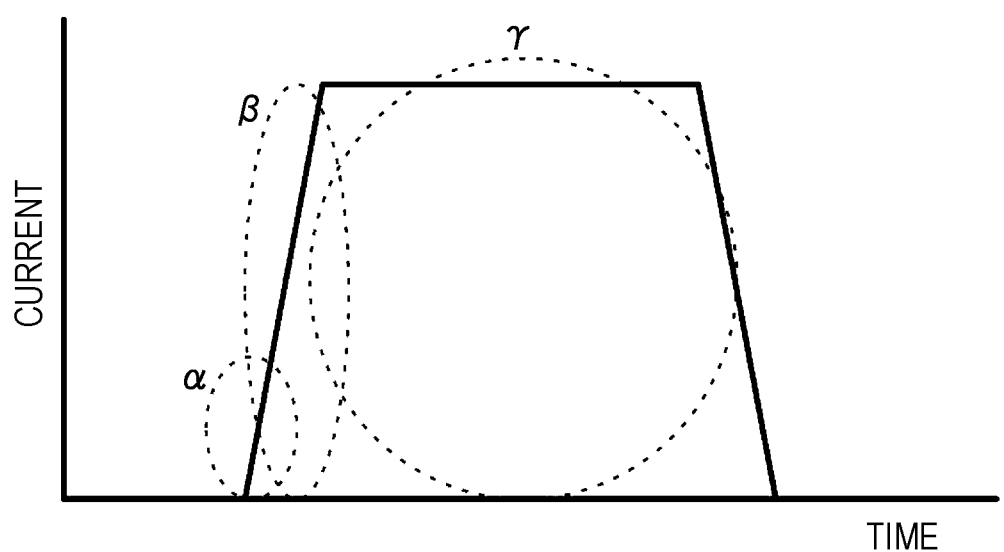
FIG. 8 illustrates a drive current pulse to be supplied to the light source.

FIG. 8 illustrates the drive current pulse to be supplied to the light source 20. In FIG. 8, the horizontal axis represents time and the vertical axis represents a current.

As illustrated in FIG. 8, a rising start part α of the drive current pulse is supplied by using the capacitor 70C formed from the parasitic capacitance. A rising part β of the drive current pulse is supplied by using the low ESL capacitor 70A. A drive current supply part γ is supplied by using the non-low ESL capacitor 70B.

(Light Emitting Device 4)

Next, the light emitting device 4 is described in detail.

FIGS. 9A to 9C illustrate the light emitting device 4 to which this exemplary embodiment is applied. FIG. 9A is a plan view. FIG. 9B is a sectional view taken along the line IXB-IXB in FIG. 9A. FIG. 9C is a sectional view taken along the line IXC-IXC in FIG. 9A. FIG. 9A is a see-through view of the light diffusion member 30. In the drawing sheet of FIG. 9A, a rightward direction is an x direction and an upward direction is a y direction. A direction orthogonal counterclockwise to the x direction and the y direction (frontward direction in the drawing sheet) is a z direction. Regarding individual members to be described below (e.g. the wiring board 10 and the light diffusion member 30), a front side (+z side) in the drawing sheet is referred to as "front face" or "front face side", and a rear side (−z side) in the drawing sheet is referred to as "back face" or "back face side". In the following description, a see-through view of each member from the front face side is referred to as "top view". In the drawing sheets of FIGS. 9B and 9C, a rightward direction is the x direction, a rearward direction is the y direction, and an upward direction is the z direction.

As illustrated in FIGS. 9A and 9B, the light source 20, the driver 50, the capacitors 70A and 70B, and the holder 60 are provided on the front face of the wiring board 10. The light diffusion member 30 is provided on the holder 60.

In the wiring board 10, for example, wiring layers including metal wires formed from copper (Cu) foil are provided on an insulating base (may be referred to as "insulating layer") made of a glass epoxy resin. The wire is a conductor pattern connected into an electric circuit and its shape is not limited. The wiring board 10 is described as a printed wiring board having four wiring layers. Examples of the base made of a glass epoxy resin include a glass composite substrate (CEM-3) and a glass epoxy substrate (FR-4).

As illustrated in FIG. 9A, the light source 20 and the driver 50 of the light emitting device 4 are arranged in the x direction on the wiring board 10.

As illustrated in FIG. 9A, the holder 60 has walls surrounding the light source 20 (in FIG. 9A, the walls are indicated by broken lines on the light source 20 side). As illustrated in FIG. 9B, the walls of the holder 60 hold the light diffusion member 30. That is, the light diffusion member 30 keeps a predetermined distance from the light source 20 on the wiring board 10 by the holder 60. The light diffusion member 30 covers the light source 20. The description "the light diffusion member 30 covers the light source 20" means that the light diffusion member 30 is provided on a path of light emitted from the light source 20 and the light emitted from the light source 20 passes through the light diffusion member 30. That is, the description means that the light source 20 and the light diffusion member 30 overlap each other in top view from the front face side of the light diffusion member 30.

The holder 60 is molded from, for example, a resin. To absorb light emitted from the light source 20, the holder 60 may be colored in, for example, black. Therefore, the light emitted from the light source 20 and radiated onto the holder 60 is absorbed by the holder 60.

As illustrated in FIGS. 9B and 9C, the wiring board 10 has a first wiring layer, a second wiring layer, a third wiring layer, and a fourth wiring layer in this order from the front face of the wiring board 10 (+z side). The first wiring layer and the second wiring layer are insulated by an insulating layer 11A. The second wiring layer and the third wiring layer are insulated by an insulating layer 11B. The third wiring layer and the fourth wiring layer are insulated by an insulating layer 11C. The insulating layers 11A, 11B, and 11C are referred to as "insulating layers 11" unless otherwise distinguished.

The first wiring layer includes a cathode wire 12, an anode wire 13F, and reference potential wires 14-1F, 14-2F, and 14-3F that are electrically isolated from each other. In FIG. 9A, parts of the cathode wire 12, the anode wire 13F, and the reference potential wire 14-3F hidden by the driver 50 are indicated by chain lines.

The second wiring layer includes a reference potential wire 14M. As indicated by broken lines in FIG. 9A, the reference potential wire 14M is provided over the entire wiring board 10, that is, so-called solidly. The cathode wire 12, the anode wire 13F, and the reference potential wires 14-1F, 14-2F, and 14-3F overlap the reference potential wire 14M in top view. In FIG. 9A, the reference potential wire 14M is provided widely so that the edges of the reference potential wire 14M project beyond all the edges of the cathode wire 12, the anode wire 13F, and the reference potential wires 14-1F, 14-2F, and 14-3F. However, the edges of the reference potential wire 14M need not project beyond all the edges of the cathode wire 12, the anode wire 13F, and the reference potential wires 14-1F, 14-2F, and 14-3F.

The third wiring layer includes a power supply potential wire 13M. The power supply potential wire 13M may be provided over the entire wiring board 10, that is, so-called solidly similarly to the reference potential wire 14M. The power supply potential wire 13M may be connected to the anode wire 13F to supply a power supply potential to the anode wire 13F.

The fourth wiring layer includes a signal wire for transmitting a signal from the controller 8 to the driver 50 to control the signal generation circuit 52. For example, FIGS. 9A and 9B illustrate signal wires 15-1 and 15-2.

As illustrated in FIGS. 9A and 9B, the cathode wire 12 of the first wiring layer has a rectangular shape as its plan shape and connects the light source 20 to the driver 50. The light source 20 is provided at one end of the cathode wire 12. That is, the light source 20 (VCSELs) is mounted on the cathode wire 12 so that the cathode wire 12 is in contact with the cathode electrode 214 of the VCSELs of the light source 20.

The other end of the cathode wire 12 is connected to the driver 50, specifically, to the drain of the MOS transistor 51 of the driver 50 (see the symbol [D] in FIG. 5).

The anode wire 13F of the first wiring layer is provided close to three sides of the cathode wire 12, that is, a −x side and ±y sides. At the lateral face 21A of the light source 20, the anode electrode 218 of the VCSELs of the light source 20 (see FIGS. 2 and 3) is connected to the anode wire 13F by bonding wires 23.

The anode wire 13F has two openings. The reference potential wires 14-1F and 14-2F are provided on an inner side of the respective openings. The reference potential wire 14-3F is provided at an end of the wiring board 10 in the x direction. The reference potential wire 14-3F is connected to the driver 50, specifically, to the source of the MOS transistor 51 of the driver 50 (see the symbol [S] in FIG. 5).

As illustrated in FIGS. 9B and 9C, the reference potential wires 14-1F and 14-3F of the first wiring layer are connected to the reference potential wire 14M of the second wiring layer by through conductors 14-1V and 14-3V provided through the insulating layer 11A. Although illustration is omitted, the reference potential wire 14-2F is also connected to the reference potential wire 14M by a through conductor provided through the insulating layer 11A. The through conductor is obtained by providing a conductive material such as copper (Cu) into a through hole of the insulating layer 11, and electrically connects a wire on the front face side of the insulating layer 11 to a wire on the back face side of the insulating layer 11. The through conductor may be referred to as "via".

The anode wire 13F of the first wiring layer is connected to the power supply potential wire 13M of the third wiring layer by a through conductor 13V provided through the insulating layer 11A and the insulating layer 11B. The through conductor 13V is electrically isolated from the reference potential wire 14M of the second wiring layer.

As illustrated in FIG. 9A, the capacitor 70A is provided between the anode wire 13F and the reference potential wire 14-1F and the capacitor 70B is provided between the anode wire 13F and the reference potential wire 14-2F in the first wiring layer of the wiring board 10. As described above, the reference potential wires 14-1F and 14-2F are provided on the inner side of the two openings of the anode wire 13F. Thus, the capacitor 70A and the capacitor 70B are surrounded by the anode wire 13F. The anode wire 13F may surround only one of the capacitors, for example, the capacitor 70A.

The anode wire 13F has the two openings and the reference potential wire 14-1F and the reference potential wire 14-2F are provided on the inner side of the respective openings. However, the anode wire 13F may have one opening and an integrated reference potential wire obtained by connecting the reference potential wire 14-1F and the reference potential wire 14-2F may be provided on an inner side of the opening.

As illustrated in FIG. 9C, the capacitor 70C is a parasitic capacitance caused between the anode wire 13F of the first wiring layer and the reference potential wire 14M of the second wiring layer in the wiring board 10. The anode wire 13F of the first wiring layer and the reference potential wire 14M of the second wiring layer are insulated by the insulating layer 11A. To increase the capacity of the capacitor 70C, the area of the anode wire 13F is increased. For example, the area of an overlap between the reference potential wire 14M of the second wiring layer and the anode wire 13F of the first wiring layer is set larger than the area of an overlap between the reference potential wire 14M of the second wiring layer and the reference potential wire 14-3F of the first wiring layer.

In the first wiring layer, the area of the anode wire 13F is set larger than the area of the reference potential wires 14-1F, 14-2F, and 14-3F.

The anode wire 13F of the first wiring layer of the wiring board 10 accounts for 50% or more of the area of the front face of the wiring board 10. The anode wire 13F of the first wiring layer of the wiring board 10 preferably accounts for 75% or more of the area of the front face of the wiring board 10.

To increase the capacity of the capacitor 70C formed from the parasitic capacitance, a thickness $t_c$ of the insulating layer 11A is 100 μm or less. The thickness $t_c$ of the insulating layer 11A is preferably 80 μm or less.

FIGS. 10A to 10C illustrate a comparative light emitting device 4' to which this exemplary embodiment is not applied. FIG. 10A is a plan view. FIG. 10B is a sectional view taken along the line XB-XB in FIG. 10A. FIG. 10C is a sectional view taken along the line XC-XC in FIG. 10A. FIG. 10A is a see-through view of the light diffusion member 30. Members having the same functions as those of the light emitting device 4 illustrated in FIGS. 9A, 9B, and 9C to which this exemplary embodiment is applied are represented by the same reference symbols. Description is omitted about the same parts as those of the light emitting device 4, and differences are described.

The light emitting device 4' differs from the light emitting device 4 in terms of the anode wire 13F and a reference potential wire 14F of the first wiring layer of the wiring board 10. The anode wire 13F has a rectangular shape as its plan shape and is provided near the lateral face 21A of the light source 20 (−y side). That is, the anode wire 13F is connected to the anode electrode 218 of the light source 20 by the bonding wires 23 and is connected to the first terminals of the capacitors 70A and 70B. The reference potential wire 14F surrounds the cathode wire 12 and the anode wire 13F. The reference potential wire 14F is connected to the reference potential wire 14M of the second wiring layer by a through conductor 14V.

In the light emitting device 4', the cathode wire 12, the anode wire 13F, and the reference potential wire 14F of the first wiring layer of the wiring board 10 overlap the reference potential wire 14M of the second wiring layer of the wiring board 10 in top view similarly to the light emitting device 4. In the first wiring layer of the wiring board 10, the reference potential wire 14F is provided except for the parts corresponding to the cathode wire 12 and the anode wire 13F. The area of an overlap between the reference potential wire 14M of the second wiring layer and the anode wire 13F of the first wiring layer is set smaller than the area of an overlap between the reference potential wire 14M of the second wiring layer and the reference potential wire 14F of the first wiring layer.

In the first wiring layer, the area of the anode wire 13F is set smaller than the area of the reference potential wire 14F.

The anode wire 13F of the first wiring layer of the wiring board 10 accounts for less than 50% of the area of the front face of the wiring board 10.

Hitherto, the wiring board 10 is generally designed such that the cathode wire 12 and the anode wire 13F are provided at parts of the first wiring layer where electrical connection is needed, and the reference potential wire 14F is provided at the remaining part. In this design, the area of the overlap between the anode wire 13F of the first wiring layer and the reference potential wire 14M of the second wiring layer in the wiring board 10 is smaller than in the case of the light emitting device 4. Therefore, the capacity of the capacitor 70C formed from the parasitic capacitance (see FIG. 5) is small. In the light emitting device 4', the capacitor 70C does not supply a sufficient current for the rising start part ("α" in FIG. 8) of the drive current pulse for causing the light source 20 to emit light. That is, in the light emitting device 4', the rising period of the drive current pulse to be supplied to the light source 20 is not sufficiently reduced.

As described above, in the light emitting device 4 to which this exemplary embodiment is applied, the area of the anode wire 13F is set to a large area to increase the area of the overlap between the anode wire 13F of the first wiring layer and the reference potential wire 14M of the second wiring layer via the insulating layer 11A in the wiring board 10.

The power of light from the light source 20 of the light emitting device 4 is 2 W to 4 W. Such a high-power light source 20 generates a large amount of heat. It is therefore appropriate to efficiently dissipate the heat from the light source 20. Thus, the light source 20 may be provided on an insulating heat dissipation base having a higher thermal conductivity than the wiring board 10, and the heat dissipation base may be provided on the wiring board 10. The thermal conductivity of the insulating layer called "FR-4" for use in the wiring board 10 is about 0.4 W/m·K. Therefore, the thermal conductivity of the heat dissipation base is preferably 10 W/m·K or more, more preferably 50 W/m·K or more, and still more preferably 100 W/m·K or more. Examples of a material having the thermal conductivity of 10 W/m·K or more include alumina ($Al_2O_3$) having a thermal conductivity of 20 to 30 W/m·K. Examples of a material having the thermal conductivity of 50 W/m·K or more include silicon nitride ($Si_3N_4$) having a thermal conductivity of about 85 W/m·K. Examples of a material having the thermal conductivity of 100 W/m·K or more include aluminum nitride (AlN) having a thermal conductivity of 150 to 250 W/m·K. Those materials may be referred to as "ceramic materials". The entire heat dissipation base may be made of the ceramic material. The heat dissipation base may be made of other insulating materials having a high thermal conductivity, such as silicon (Si) undoped with impurities.

In the light emitting device 4 to which this exemplary embodiment is applied, the low ESL capacitor 70A and the non-low ESL capacitor 70B are used. If the capacity of the capacitor 70C formed from the parasitic capacitance is large, the low ESL capacitor 70A may be omitted.

In the light emitting device 4 to which this exemplary embodiment is applied, the capacitor 70C is the parasitic capacitance caused between the anode wire 13F of the first wiring layer and the reference potential wire 14M of the second wiring layer in the wiring board 10. A wiring layer to which the reference potential is supplied (referred to as "capacitor layer") may be provided in the insulating layer 11A to face the anode wire 13F, and a capacitance caused between the anode wire 13F and the capacitor layer may be used as the capacitor 70C. The capacitance caused between the anode wire 13F and the capacitor layer is another example of the capacitive component.

In the light emitting device 4 to which this exemplary embodiment is applied, the light source 20 and the driver 50 are provided on the front face of the wiring board 10. A circuit board having the light source 20 and a circuit board having the driver 50 may be provided separately and connected by a flexible flat cable (FFC) or a flexible printed circuit (FPC).

In the light emitting device 4 to which this exemplary embodiment is applied, the light diffusion member 30 that outputs incident light at a larger divergence angle through diffusion is used as an example of an optical member. The optical member may be a diffractive optical element (DOE) that outputs incident light with its direction changed to a different direction. The optical member may also be a condenser lens, a microlens, a protective cover, or other transparent members.

The foregoing description of the exemplary embodiments of the present disclosure has been provided for the purposes of illustration and description. It is not intended to be exhaustive or to limit the disclosure to the precise forms disclosed. Obviously, many modifications and variations will be apparent to practitioners skilled in the art. The embodiments were chosen and described in order to best explain the principles of the disclosure and its practical applications, thereby enabling others skilled in the art to understand the disclosure for various embodiments and with the various modifications as are suited to the particular use contemplated. It is intended that the scope of the disclosure be defined by the following claims and their equivalents.

What is claimed is:

1. A light emitting device comprising:
  a wiring board having a first wiring layer and a second wiring layer adjacent to the first wiring layer via an insulating layer; and
  a laser having a cathode electrode and an anode electrode, mounted on the wiring board, and driven through low-side driving,
  wherein the first wiring layer comprises:
    a cathode wire connected to the cathode electrode;
    an anode wire connected to the anode electrode; and
    a first reference potential wire connected to a reference potential,
  wherein the second wiring layer comprises a second reference potential wire connected to the reference potential, and
  wherein an area of an overlap between the second reference potential wire and the anode wire is larger than an area of an overlap between the second reference potential wire and the first reference potential wire.

2. The light emitting device according to claim 1, wherein an area of the anode wire is larger than an area of the first reference potential wire.

3. The light emitting device according to claim 2, wherein the area of the anode wire is 50% or more as large as an area of the wiring board.

4. The light emitting device according to claim 3, wherein the area of the anode wire is 75% or more as large as the area of the wiring board.

5. The light emitting device according to claim 4, wherein a thickness of the insulating layer is 100 μm or less.

6. The light emitting device according to claim 3, wherein a thickness of the insulating layer is 100 μm or less.

7. The light emitting device according to claim 2, wherein the area of the anode wire is 75% or more as large as an area of the wiring board.

8. The light emitting device according to claim 7, wherein a thickness of the insulating layer is 100 μm or less.

9. The light emitting device according to claim 2, wherein a thickness of the insulating layer is 100 μm or less.

10. The light emitting device according to claim 1, wherein an area of the anode wire is 50% or more as large as an area of the wiring board.

11. The light emitting device according to claim 10, wherein the area of the anode wire is 75% or more as large as the area of the wiring board.

12. The light emitting device according to claim 11, wherein a thickness of the insulating layer is 100 μm or less.

13. The light emitting device according to claim 10, wherein a thickness of the insulating layer is 100 μm or less.

14. The light emitting device according to claim 1, wherein an area of the anode wire is 75% or more as large as an area of the wiring board.

15. The light emitting device according to claim 14, wherein a thickness of the insulating layer is 100 μm or less.

16. The light emitting device according to claim 1, wherein a thickness of the insulating layer is 100 μm or less.

17. The light emitting device according to claim 1, wherein the laser is a surface emitting laser element array having a plurality of surface emitting laser elements on a common semiconductor substrate.

18. The light emitting device according to claim 1, further comprising an optical member that changes at least one of a direction or a divergence angle of light emitted from the laser.

19. An optical device comprising:

the light emitting device according to claim 1; and a light receiver that receives light emitted from the laser of the light emitting device and reflected on a target, wherein the light receiver outputs a signal corresponding to a period from light emission from the laser to light reception at the light receiver.

20. A measurement device that measures a three-dimensional shape of a target, the measurement device comprising:

the optical device according to claim 19; and a three-dimensional shape determiner that determines the three-dimensional shape of the target based on light emitted from the laser of the optical device, reflected on the target, and received by the light receiver of the optical device.

* * * * *